United States Patent [19]
Russell et al.

[11] Patent Number: 5,942,748
[45] Date of Patent: Aug. 24, 1999

[54] LIQUID LEVEL SENSOR AND DETECTOR

[75] Inventors: Stephen D. Russell, San Diego; Wadad B. Dubbelday, Spring Valley, both of Calif.

[73] Assignee: The United States of America as represented by the Secretary of the Navy, Washington, D.C.

[21] Appl. No.: 08/806,958

[22] Filed: Feb. 26, 1997

Related U.S. Application Data

[63] Continuation-in-part of application No. 08/118,900, Sep. 9, 1993, abandoned.

[51] Int. Cl.$^6$ ............................. H01L 27/14; H05B 33/00
[52] U.S. Cl. ................................. 250/214.1; 250/484.2; 250/577; 73/293; 257/431
[58] Field of Search ............................. 250/214.1, 577, 250/483.1, 484.2, 486.1, 227.11; 73/293; 257/431, 432, 433, 434, 436, 290

[56] References Cited

U.S. PATENT DOCUMENTS

| | | |
|---|---|---|
| 3,639,770 | 2/1972 | Zizelmann . |
| 3,808,887 | 5/1974 | Buttriss . |
| 4,650,992 | 3/1987 | Ruhrmann . |
| 4,752,141 | 6/1988 | Sun et al. . |
| 5,004,913 | 4/1991 | Kleinerman . |
| 5,257,090 | 10/1993 | Meinzer et al. .................... 250/205 |
| 5,272,355 | 12/1993 | Namavar et al. . |
| 5,332,316 | 7/1994 | Kleinerman . |
| 5,453,624 | 9/1995 | Sailor et al. . |

OTHER PUBLICATIONS

Dubbelday et al., "Photoluninescent thin–film porous silicon on sapphire". *Appl. Phys. Lett.*, 62 (14), Apr. 5, 1993, pp. 1694–1696.

Canham, "Silicon quantum wire array fabrication by electrochemical and chemical dissolution of wafers", *Appl. Phys. Lett.*, 57 (10), Sep. 3, 1990, pp. 1046–1048.

Fathauer et al., "Visible luminescence from silicon wafers subjected to stain etches", *Appl. Phys. Lett.*, 60 (8), Feb. 24, 1992, pp. 995–997.

Brandt et al., "The Origin of Visible Luminescence From 'Porous Silicon': A New Interpretation", *Solid State Communications*, vol. 81, No. 4, 1992, pp. 307–312.

Bsiesy et al., "Photoluminescence of high porosity and of electrochemically oxidized porous silicon layers", *Surface Science*, 254, 1991, pp. 195–200.

(List continued on next page.)

*Primary Examiner*—Edward P. Westin
*Assistant Examiner*—Kevin Pyo
*Attorney, Agent, or Firm*—Harvey Fendelman; Michael A. Kagan; Peter A. Lipovsky

[57] ABSTRACT

A light emitting photonic structure has a transparent substrate, such as sapphire, supporting a layer of group IV semiconductor material, such as silicon, having at least one porous region from which light is emitted as a response to a stimulus. An example of such a photonic structure is described in U.S. patent application Ser. No. 08/118,900. The photonic structure can be used to assess the presence of various fluids. The photonic structure is disposed to be contacted by the fluid to be sensed should it be present. The light emitting region of the photonic structure is stimulated by an appropriate source, and the light emitted by the photonic source is detected by a detector. The light emitting region of the photonic structure will emit a certain luminescence in air and should the light emitting region be contacted by other fluid or fluids, this luminescence can be affected and the corresponding change in luminescence can be detected thus the presence of these fluids can be sensed. Because the photonic structure has a light emitting region is formed on a transparent substrate, the light emitting region can be both excited and interrogated through the transparent substrate and outside of the presence of the fluid to be sensed. Hence absorption of the excitation radiation used as well as the luminescence emitted by the fluid to be sensed is eliminated.

30 Claims, 4 Drawing Sheets

OTHER PUBLICATIONS

Dubbelday et al., "Study of Photoluminescent Thin Film Porous Silicon on Sapphire", *Mat. Res. Soc. Symp. Proc.*, vol. 283, 1993, pp. 163–166.

Lauerhaas et al., "Reversible Luminescence Quenching of Porous SI by Solvents", *Materials Research Society Symposium Proceedings,* vol. 256, pp. 137–141, 1992.

Milewski et al., "Light Emission From Crystalline Silicon And Amorphous Silicon Oxide ($SiO_x$) Nanoparticles", *Journal of Electronic Materials,* vol. 23, No. 1, 1994, pp. 57–62.

Ohno et al., "Intrinsic Origin Of Visible Light Emission From Silicon Quantum Wires: Electronic Structure And Geometrically Restricted Exciton", *Physical Review Letters,* vol. 69, No. 16, Oct. 1992, pp. 2400–2403.

Perez et al., "Direct Evidence For The Amorphous Silicon Phase In Visible Photoluminescent Porous Silicon", *Applied Physics Letters,* vol. 61, No. 5, Aug. 1992, pp. 563–565.

Sarathy et al., "Demonstration Of Photoluminescence In Nonanodized Silicon", *Applied Physics Letters,* vol. 60, No. 13, 1992, pp. 1532–1534.

Sawada et al., "Mechanisms Of Visible Photoluminescence In Porous Silicon", *Physical Review B* , vol. 49, No. 8, 1994, pp. 5236–5245.

Lauerhaas et al., "Reversible Luminescence or Porous Si by Solvents", *Journal American Chemical Society,* vol. 114, 1992, pp. 1911–1912.

Lauerhaas et al., "Chemical Modification of the Photoluminescence Quenching of Porous Silicon", *Science,* vol. 261, Sep. 17, 1993, pp. 1567–1568.

LIQUID LEVEL SENSOR AND DETECTOR

CROSS-REFERENCE TO RELATED APPLICATION

This is a continuation-in-part of U.S. patent application Ser. No. 08/118,900, filed Sep. 9, 1993 now abandoned.

INCORPORATION BY REFERENCE

U.S. patent application Ser. No. 08/118,900, filed Sep. 9, 1993, and now abandoned, is hereby incorporated into this application in its entirety.

BACKGROUND OF THE INVENTION

Since the discovery of photoluminescent porous silicon, see the article by L. T. Canham, "Silicon Quantum Wire Array Fabrication By Electrochemical And Chemical Dissolution Of Wafers", *Applied Physics Letters*, Vol. 57, No. 10, September 1990, pp. 1096–1098, porous silicon has emerged as a potential photonic source compatible with silicon microelectronics. The light emission mechanism of porous silicon, however, is still not fully understood. A predominant theory is related to the confinement of electrons and holes in a silicon wire or particle with dimensions on the order of tens of nanometers.

In such cases, it is hypothesized that the electrons and holes may recombine and efficiently emit light if there are few non-radiative mechanisms competing for the charge carriers. This theory, called quantum confinement, has been observed in other materials systems and has been theoretically modeled in silicon, see the article: T. Ohno, K. Shiraishi and T. Ogawa, "Intrinsic Origin Of Visible Light Emission From Silicon Quantum Wires: Electronic Structure And Geometrically Restricted Exciton", *Physical Review Letters*, Vol. 69, No. 16, October 1992, pp. 2400–2403 and the article: S. Sawada, N. Hamada and N. Ookubo, "Mechanisms Of Visible Photoluminescence In Porous Silicon", *Physical Review B*, Vol. 49, No. 8, 1994, pp. 5236–5245.

These silicon nanoparticles or nanowires are predicted to have a direct band gap, thus allowing efficient electron-hole recombination without employing less efficient phonon-assisted transitions. Other theories note that silicon compounds such as amorphous silicon, silicon oxides, and siloxene derivatives also luminesce in the visible region of the spectrum and propose those models as a source of the luminescence, see the articles: J. M. Perez, J. Villalobos, P. McNeill, J. Prasad, R. Cheek, J. Kelber, J. P. Estrera, P. D. Stevens and R. Glosser, "Direct Evidence For The Amorphous Silicon Phase In Visible Photoluminescent Porous Silicon", *Applied Physics Letters*, Vol. 61, No. 5, August 1992, pp. 563–565; P. D. Milewski, D. J. Lichtenwalner, P. Mehta, A. Kingon, D. Zhang and R. M. Kolbas, "Light Emission From Crystalline Silicon And Amorphous Silicon Oxide ($SiO_x$) Nanoparticles", *Journal of Electronic Materials*, Vol. 23, No. 1, 1994, pp. 57–62; and M. S. Brandt, H. D. Fuchs, M. Stutzmann, J. Weber and M. Cardona, "The Origin Of Visible Luminescence From 'Porous Silicon': A New Interpretation", *Solid State Communications*, Vol. 81, No. 4, 1992, pp. 307–312.

Irrespective of the complete understanding of the physical mechanism involved, porous silicon properties may be utilized for practical devices.

Typically, the method of fabricating porous silicon in bulk silicon wafers uses an anodic oxidation process with a backside contact to the silicon anode and a platinum (Pt) counter-electrode in a hydrofluoric acid (HF) and ethanol solution, see the Canham article cited above as well as the article by A. Bsiesy, J. C. Vial, F. Gaspard, R. Herino, M. Ligeon, F. Muller, R. Romestain, A. Wasiela, A. Halimaoui and G. Bomchil, "Photoluminescence Of High Porosity And Of Electrochemically Oxidized Porous Silicon Layers", *Surface Science*, Vol. 254, 1991, pp. 195–200.

Using low current densities, silicon wafers are made porous by the electrochemical dissolution of silicon. Thin films of porous silicon on transparent insulating substrates (sapphire, quartz and the like) have been fabricated which allow analysis of the optical properties from either side of the porous layer and allow the design of novel photonic devices as described in U.S. patent application Ser. No. 08/118,900, filed Sep. 9, 1993 incorporated by reference herein.

Due to the insulating nature of the transparent substrates, the formation of the porous silicon typically use a stain etch composed of hydrofluoric acid (HF), nitric acid ($HNO_3$) and distilled water in a ratio of 1:5:10 (see R. W. Fathauer, T. George, A. Ksendzov and R. P. Vasquez, "Visible Luminescence From Silicon Wafers Subjected To Stain Etches", *Applied Physics Letters*, Vol. 60, No. 8, 1992, pp. 995–997; and J. Sarathy, S. Shih, K. Jung, C. Tsai, K. H. Li, D. L. Kwong, J. C. Campbell, S. L. Yau and A. J. Bard, "Demonstration Of Photoluminescence In Nonanodized Silicon", *Applied Physics Letters*, Vol. 60, No. 13, 1992, pp. 1532–1534) to form the porous layers without need for electrical contact to the backside of the wafer.

Alternatively, a technique described in incorporated U.S. patent application Ser. No. 08/118,900 uses optical excitation rather than electrical contact to form porous silicon. Further description may be found in the articles: W. B. Dubbelday, Szaflarski, D. M., Shimabukuro, R. L., and Russell, S. D., "Study of Photoluminescent Thin Film Porous Silicon On Sapphire", *Materials Research Society Symposium Proceedings*, Vol. 283, 1993, pp. 161–166 and W. B. Dubbelday, Szaflarski, D. M., Shimabukuro, R. L., Russell, S. D. and Sailor, M. J., "Photoluminescent Thin-film Porous Silicon On Sapphire", *Applied Physics Letters*, Vol. 62, No. 14, April 1993, pp.1694–1696.

Figure 1:
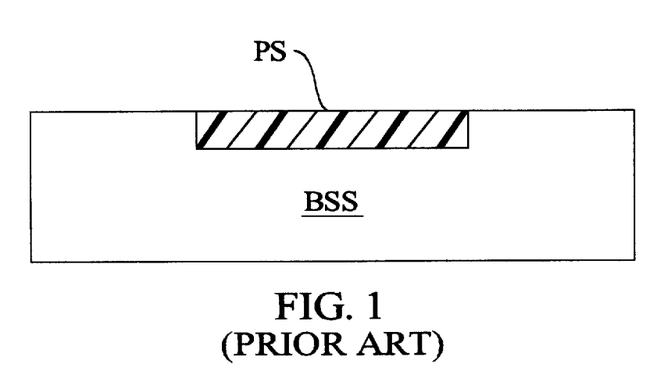
FIG. 1 is a cross-section depiction of a prior art porous silicon in a bulk silicon substrate.

Lauerhaas et al reported in the article identified as: J. M. Lauerhaas, G. M. Credo, J. L. Heinrich and M. J. Sailor "Reversible Luminescence Quenching of Porous Si By Solvents", *Journal of the American Chemical Society*, Vol. 114, 1992, pp. 1911–1912, that a reversible quenching of photoluminescence is obtained from porous silicon layers fabricated in bulk silicon due to surface adsorbates. In FIG. 1, a cross-section of a prior art porous silicon layer PS formed in a bulk silicon substrate BSS is shown.

The degree of quenching reported by Lauerhaas et al is considered to nominally scale with the solvent dipole moment. Two notable exceptions to this empirical relationship reported by these authors is the lack of quenching observed by exposure to water vapor, and a large quenching of the photoluminescence in the presence of non-polar benzene.

This effect as reported by Lauerhaas et al does not readily lend itself to some device applications due to the need to photoexcite, and detect emitted light from, the porous silicon side of the wafer.

An improved design exploiting the photoluminescence quenching effect of porous silicon will enhance its use in the commercial market.

SUMMARY OF THE INVENTION

The present invention is directed to an apparatus and use of a photonic structure for assessing the presence of various fluids that, in one embodiment, can be used as a liquid level sensor. An example of a photonic structure that can be used is described in U.S. patent application Ser. No. 08/118,900 incorporated by reference herein.

Briefly, this photonic structure includes a transparent substrate and a layer of group IV semiconductor material formed on the transparent substrate. The layer of the group IV semiconductor material is provided with at least one region that is made relatively porous compared to a portion of the group IV semiconductor material layer outside of the region. From this region, light is emitted as a response to a stimulus.

According to the invention, the photonic structure is disposed to be contacted by the fluid to be sensed should it be present. The light emitting region of the photonic structure is stimulated by an appropriate excitation source, and the light emitted by the photonic source is detected by an appropriate detector.

It is known that the light emitting region of the photonic structure will emit a certain luminescence in air and that should the light emitting region be contacted by another fluid or fluids, this luminescence can be affected and the corresponding change in luminescence can be detected.

By utilizing a photonic structure that has a light emitting region made a part of a semiconductor material that is formed on a transparent substrate, the light emitting region can be both excited and interrogated through the transparent substrate and outside of the presence of the fluid to be sensed. Hence absorption of the excitation used as well as the luminescence emitted by the fluid to be sensed is minimized.

As stated in the incorporated patent application, the group IV semiconductor material can be chosen from a wide variety of materials including silicon, germanium, carbon, tin, silicon-germanium, silicon carbide for example, and can be of single crystal structure, polycrystalline structure, or amorphous structure. The transparent substrate can be chosen from sapphire, glass, quartz, fused silica, diamond, ruby, yttria alumina garnet, yttria stabilized zirconium, magnesium fluoride or magnesium oxide, for example. The preferred stimulus is optical in nature and the response is photoluminescence versus stimulus that is electrical in nature that may or may not be feasible in certain sensing applications.

An object of this invention is to provide a way to sense one or more fluids.

Another object of this invention is to use silicon to sense one or more fluids.

Still another object of this invention is to use porous silicon to sense one or more fluids.

Yet another object of this invention is to use porous silicon capable of luminescing to sense one or more fluids.

Yet still another object of this invention is to use porous silicon capable of luminescing to sense one or more fluids in which said luminescing is contingent upon the fluid exposed to said porous silicon.

Another object of this invention is to use porous silicon capable of luminescing to sense one or more fluids in which said porous silicon is disposed on a transparent substrate to permit direct excitation of said luminance as well as detection of said luminance through said transparent substrate.

Another object is to provide a fabrication of porous silicon combined with advanced microelectronic technology on an insulating substrate for sensing fluid that offers compatibility with advanced microelectronic technology, such as, for example, bipolar, BiCMOS, NMOS, PMOS, and CMOS.

Another object is to provide a porous fluid sensing silicon on an insulating substrate having advantages over porous silicon in bulk silicon, such as, for example, higher speed, enhanced hardness to radiation, and enhanced high temperature and cryogenic temperature operation.

Yet another object is to provide a luminescent porous silicon-on-sapphire device for sensing fluids that offers excellent dielectric isolation, and that offers improved thermal conductivity, transparency, rigidity, flatness, hardness and resistance to chemicals.

These and other objects of the invention will become more apparent from the following specification when taken in conjunction with the accompanying drawings and claims.

BRIEF DESCRIPTION OF THE DRAWINGS

FIGS. 5 A–D show, for illustration purposes, various sensed fluid levels and their corresponding luminance intensity.

DESCRIPTION OF THE PREFERRED EMBODIMENT

FIG. 1 depicts a cross-section of a prior art porous silicon layer PS formed on a bulk silicon substrate BSS. The porous layer can be formed using the electrochemical etching or optical techniques described in the references cited above. Typically, the layer is formed to a depth of about 1 to 30 microns in a bulk silicon substrate which is nominally 500 microns thick.

Porous silicon formed of a bulk silicon substrate does not readily lend itself to some device applications due to the required photoexcitation and detection of emitted light from the porous silicon side of the wafer. This is the case in which it is desired to use the photoluminescence properties of the porous silicon, or more particularly the quenching thereof, to detect whether one or more fluids are exposed to the porous silicon. If one is required to excite and interrogate the luminescence of the porous silicon through the fluid or fluids desired to be sensed, one would have to mitigate the undesirable absorption of the excitation and luminescence by the fluids, as well accomodate the required physical logistics involved.

The invention described herein is a fluid level sensor and detector made from porous silicon on a transparent substrate. In a preferred embodiment, the sensor is optically interrogated to sense its photoluminescence which changes in response to the presence of various fluids, whether these be liquids, gases or vapors. The term "fluid" as used throughout this disclosure is meant to imply any physical form that may be adsorbed or deposited onto or adjacent to the porous silicon surface.

Figure 2:
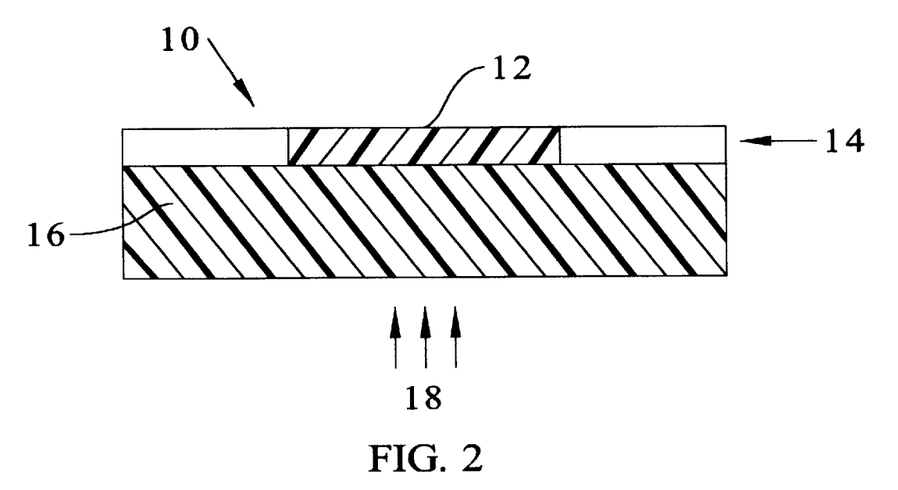
FIG. 2 is a cross-section depiction of a photonic device according to one embodiment of the invention.

Referring now to FIG. 2, a cross-sectional view of a silicon-on-sapphire (SOS) photonic structure 10 includes a light emitting (photonic) silicon region 12 formed within a silicon layer 14 upon a transparent sapphire ($Al_2O_3$) substrate 16. As described in the referenced patent application incorporated by reference, region 12 is made porous, such as by a purely chemical or stain etching process, to emit light while undergoing photonic or electronic stimulation from an external source 18. Successful porosity and luminosity has been achieved in a region ~10 microns deep.

In a preferred embodiment of the invention, photonic structure 10 is used in a fluid sensing apparatus that will be further described and that preferably utilizes a photonic stimulation source to generate photoluminescence. It should be understood that other embodiments may be envisioned using suitable electrodes or other appropriate means to generate an electronic stimulation for electroluminescence or cathodoluminescence.

Figure 3:
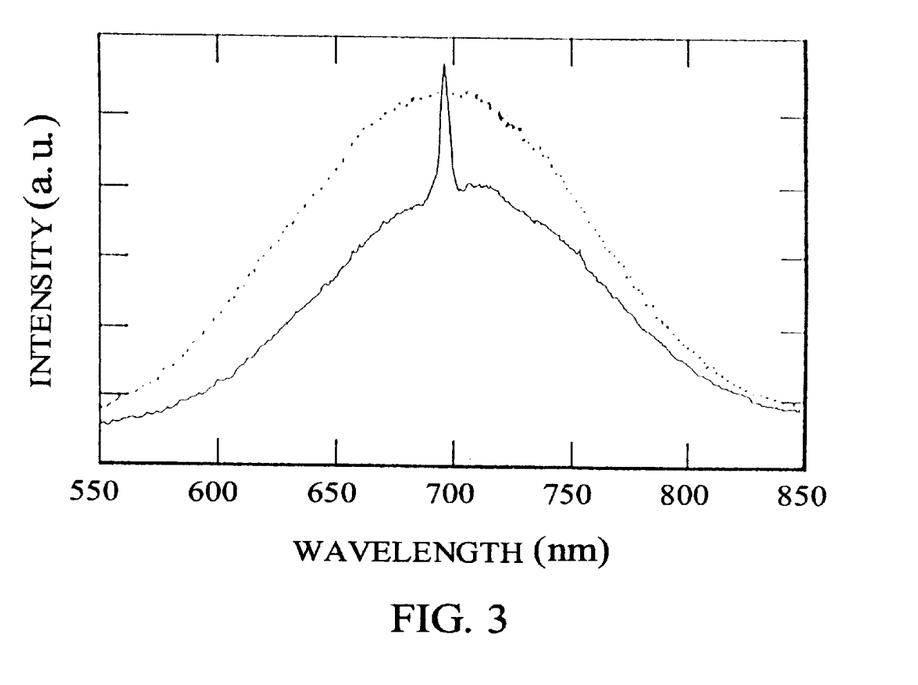
FIG. 3 is a graphical representation of emission spectra of a porous silicon on sapphire device as collected separately from the silicon and sapphire sides of the device.

FIG. 3 shows the photoluminescence spectra of a porous silicon on sapphire (SOS) film. The porous SOS sample shows photoluminescence signals comparable to those published for porous bulk silicon. The two curves shown are the emission spectra obtained when the sample is illuminated and emission collected from the silicon side (dotted line) and from the sapphire side (solid line) of the wafer. The photoluminescence maximizes in intensity at ~700 nm with a width of ~100 nm. The spectra demonstrates that the interrogation of the porous silicon film on a sapphire substrate may be performed from the backside (i.e. that opposite the porous silicon side) of the wafer.

Figure 4:
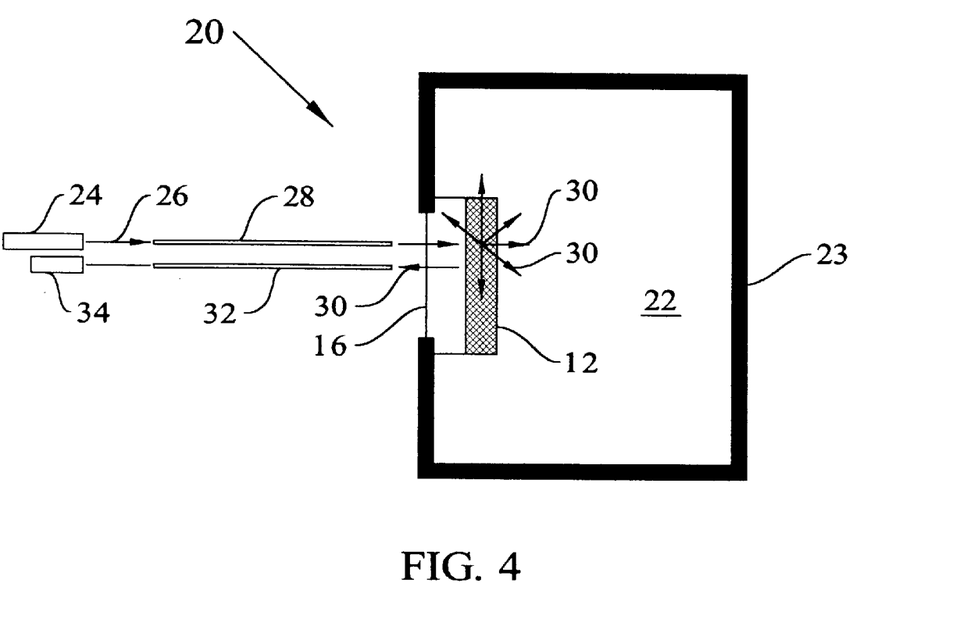
FIG. 4 is a representative fluid sensing method and apparatus according to one embodiment of the invention.
Figure 5A:
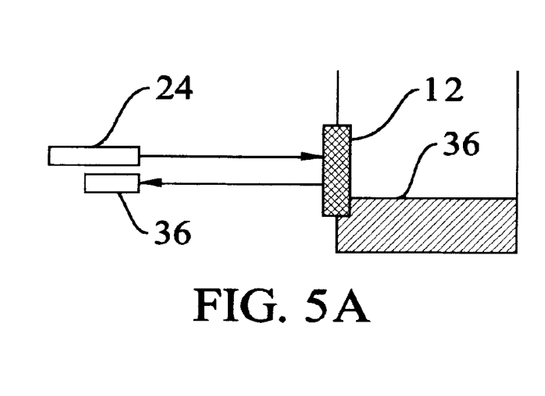
Figure 5B:
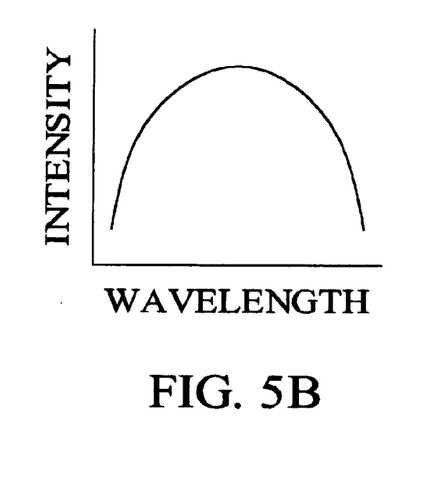
Figure 5C:
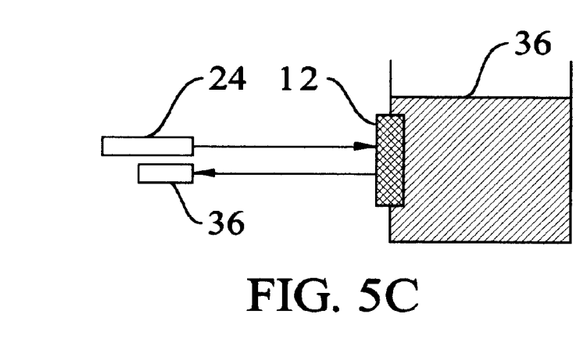
Figure 5D:
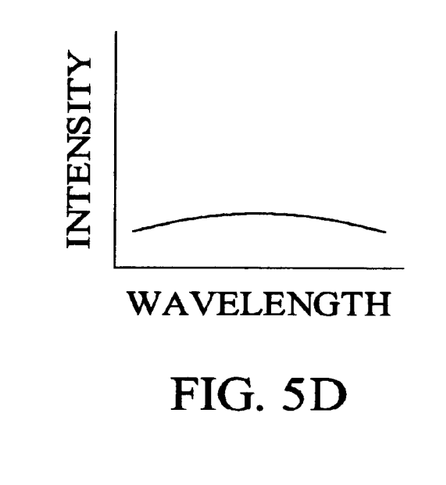

FIG. 4 describes the apparatus and operation of a porous silicon fluid level sensor or detector 20 according to the invention. Porous silicon light emitting region 12 is disposed to be in contact with an environment 22 to be monitored and is operably coupled to a receptacle 23 to be contacted by fluids within environment 22. The porous silicon region is also in physical contact with underlying transparent substrate 16. The tranparent substrate 16 is disposed so that any light emitted from light emitting region 12 is viewable from outside receptacle 23.

An excitation source 24 emits energy 26, a preferred embodiment of which is light energy, which is coupled to the porous silicon portion 12 through transparent substrate 16 by a coupling 28. In a preferred embodiment, coupling 28 is an optical fiber.

Depending on the condition of the environment 22, that is whether a fluid or fluids are present within this environment, porous silicon region 12 will have a different response. If there is an absence of certain fluids in contact with porous silicon region 12, for example if environment 22 is primarily filled with air, then the porous silicon region will emit light in response to the excitation via a photoluminescence process.

The emitted photoluminescence 30, characteristic of the state of the environment 22 being monitored, is coupled by a second coupling 32 to a detector 34. In the preferred embodiment, second coupling 32 is an optical fiber and detector means 34 is a photodiode.

If certain fluids are present in environment 22 such as for example benzene, methanol, acetone, diethyl ether, methylene chloride, tetrahydrofuran, toluene, o-xylene and water and one or more of these fluids contact porous silicon region 12, then the porous silicon region will emit less light via the photoluminescence process or no light at all as compared to the porous region exposed to air.

FIGS. 5 A–D show the effect of the environment on the photoluminesce of the porous silicon region 12 for the embodiment of the fluid level sensor described above. As can be seen in FIGS. 5A and 5B, a low level and hence degree of contact of fluid 36 with porous silicon region 12 results in a high degree of luminosity versus that shown by FIGS. 5C and 5D where a high level and hence degree of contact by fluid 36 with porous silicon region 12 produces a low porous silicon luminosity.

Figure 6:
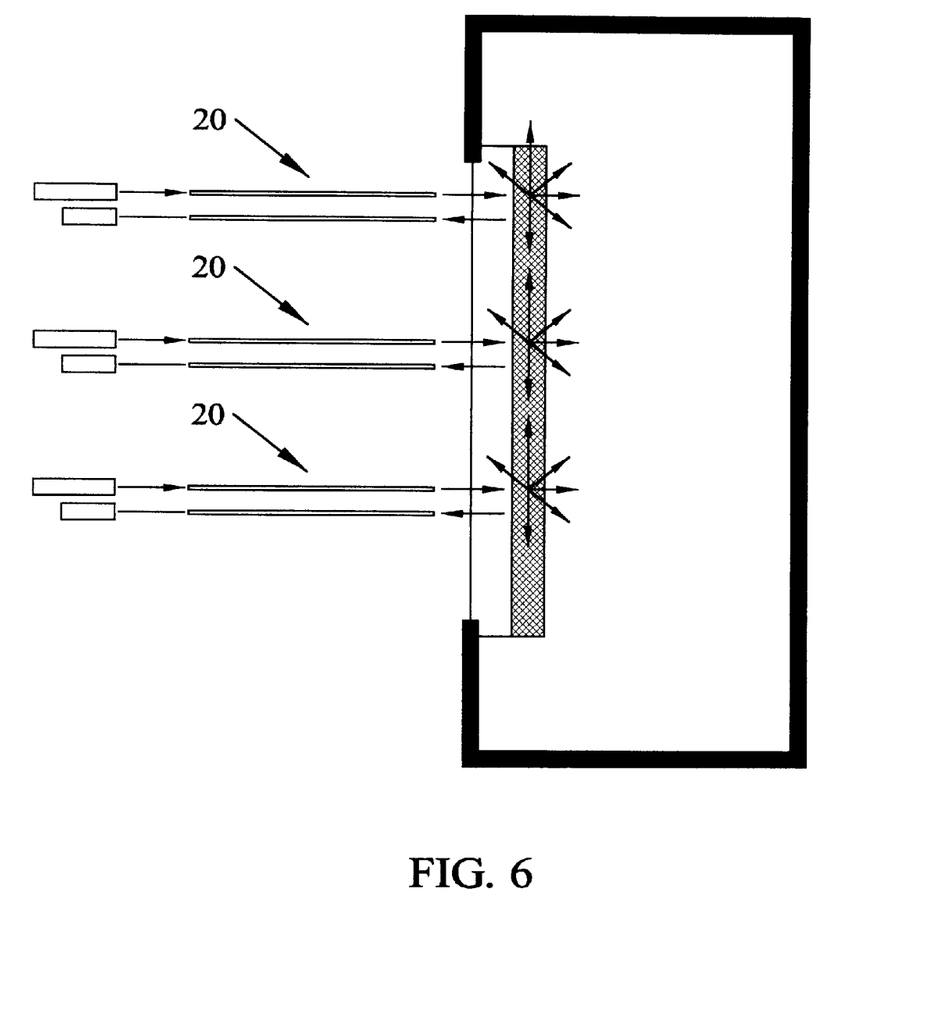
FIG. 6 is a representative fluid sensing method and apparatus according to another embodiment of the invention.

FIG. 6 illustrates how a number of fluid level sensor/detectors 20 can be disposed to sense and detect fluids at a number of locations within a fluid receptacle.

This invention allows the exploitation of the luminescent properties of porous silicon in a practical device for sensing the presence of fluids exposed to the porous silicon. The invention permits the use of optical interrogation of the status of the environment in contact with the sensor rather than requiring electrical interconnections which may not be feasible or advantageous in many applications. Optical interrogation from the backside of the photonic structure minimizes problems associated with absorption of the interrogating light by the environment, ambient solutions or gases which may occur if the interrogating light were incident on the front (silicon) side of the sensor.

In addition, the fabrication of a porous silicon sensor in silicon on insulator offers compatibility with advanced microelectronic technology, such as bipolar, BiCMOS, NMOS, PMOS and CMOS, that have been successfully demonstrated in conventional Silicon On Insulator (SOI) technologies. Silicon On Insulator technologies (including Silicon On Sapphire (SOS), and Silicon On Quartz (SOQ)) are proven materials for fabrication of integrated circuitry. They have several distinct advantages over bulk silicon including allowing microelectronic devices and circuits to have higher speed capability, improved radiation hardness, and high temperature as well as cryogenic temperature applications as well as other various applications. In electronic circuits, SOI has intrinsically lower parasitic capacitances and provides better device isolation than bulk silicon. Therefore, the herein disclosed invention is amenable with monolithic integration with Integrated Circuit (IC) technology.

The use of the sapphire as the insulating substrate also offers excellent dielectric isolation, thermal conductivity, transparency, rigidity, flatness, hardness, and resistance to chemicals.

While there are chemical resistance advantages of using porous silicon on sapphire, the ability to deposit and crystallize silicon on a variety of transparent substrates allows for a variety of light emitting silicon structures including but not limited to those having substrates of: glass, quartz, fused silica, spinel, magnesium oxide, magnesium fluoride, diamond, yttria stabilized zirconium (YSZ), ruby also know as chromium doped sapphire ($Cr:Al_2O_3$), yttria alumina garnet (YAG) and others. In addition, the silicon used may have various degrees of crystallinity ranging from single crystal defect free material, to highly disordered nearly amorphous or amorphous silicon. Variations in silicon film thickness, appropriate patterning or doping of the silicon will also be apparent to one of ordinary skill in the art from the teachings disclosed herein. In addition to the above mentioned variety of SOI substrates, those developed in the future may also be appropriately substituted to meet the requirements of the job at hand.

Obviously other designs may be employed for the sensor or level detector of the invention, such as a multilayered structure containing a sensing porous silicon portion fabricated adjacent or on top of an iterrogating excitation source and detector, and the like. Interrogation of the porous region from the front rather than backside as proposed in the preferred embodiment may be readily accommodated. Use of a plurality of sensor in a one dimensional linear fashion, or even a two or three dimensional array is also envisioned. Furthermore, raster scanning the interrogating light or using some other positioning means to sense at different physical locations within the environment is also envisioned. Also, detection at a plurality of wavelengths may be utilized to differentiate or identify fluids in contact with the sensor. The level sensor or detector may be utilized with liquid, gaseous or vapor environments, and is sensitive to a variety of chemical components including: benzene, methanol, acetone, diethyl ether, methylene chloride, tetrahydrofuran, toluene, o-xylene and despite previous reports, water may be detected in sufficient quantities. Other chemicals not listed may also be detected using the disclosed invention, including those not at typical room temperature.

Obviously, many modifications and variations of the invention are possible in the light of the above teachings. It is therefore to be understood that within the scope of the appended claims the invention may be practiced otherwise than as specifically described.

What is claimed is:

1. An apparatus comprising:
    a receptacle for containing a fluid to be sensed; and
    a photonic structure including
        a transparent substrate and
        a layer of group IV semiconductor material formed on said transparent substrate having a light emitting region that is relatively porous compared to a portion of said layer outside said region, said light emitting region being disposed to be contacted by said fluid when said fluid is present,
        said photonic structure being operably coupled to said receptacle so that light emitted from said light emitting region is viewable through said transparent substrate from outside said receptacle.

2. The apparatus of claim 1 further including:
    an excitation source for stimulating said light emitting region of said photonic structure, said excitation source emitting energy that causes said light emitting region to luminesce in the presence of air, said light emitting region having a different degree of luminescence when exposed to a fluid besides air.

3. The apparatus of claim 2 further including:
    a detector for detecting luminescence from said photonic structure.

4. The apparatus of claim 1 further including:
    an excitation source for stimulating said light emitting region of said photonic structure through said transparent substrate of said photonic structure, said excitation source emitting energy that causes said light emitting region to have a degree of luminescence in the presence of air, said light emitting region having a different degree of luminescence when exposed to a fluid besides air.

5. The apparatus of claim 4 further including:
    a detector for detecting luminescence from said photonic structure as perceived through said transparent substrate of said photonic structure.

6. The apparatus of claim 5 further including
    a first coupling member for coupling said energy from said excitation source to said transparent substrate of said photonic structure, and
    a second coupling member for coupling said luminescence from said light emitting region of said photonic structure, and as perceived through said transparent substrate of said photonic structure, to said detector.

7. The apparatus of claim 6 in which said coupling members are optical fiber.

8. The apparatus of claim 1 in which a series of said photonic structures are operably coupled to said receptacle for sensing the presence of fluid at a number of locations within said receptacle.

9. The photonic structure of claim 1 wherein said group IV semiconductor material is at least one of silicon, germanium, carbon, and tin.

10. The photonic structure of claim 1 wherein said group IV semiconductor material is at least one of group IV semiconductor alloys silicon-germanium and silicon carbide.

11. The photonic structure of claim 1 wherein said group IV semiconductor material is at least one of single crystal structures, polycrystalline structures, and amorphous structures.

12. The photonic structure of claim 1 wherein said transparent substrate is sapphire.

13. The photonic structure of claim 1 wherein said transparent substrate is at least one of glass, quartz, fused silica, diamond, ruby, yttria alumina garnet, yttria stabilized zirconium, chromium doped sapphire, magnesium fluoride, and magnesium oxide.

14. A method comprising:
    providing a receptacle for containing a fluid to be sensed;
    providing a photonic structure that includes
        a transparent substrate and
        a layer of group IV semiconductor material formed on said transparent substrate having a light emitting region that is relatively porous compared to a portion of said layer outside said region; and
    operably coupling said photonic structure to said receptacle so that said light emitting region will contact said fluid when said fluid is present and so that light emitted from said light emitting region is viewable through said transparent substrate from outside said receptacle.

15. The method of claim 14 further including:
    exciting said light emitting region of said photonic structure with energy from an excitation source, said energy known to cause said light emitting region to luminesce in the presence of air.

16. The method of claim 15 further including:
    detecting luminescence from said photonic structure with a detector, a luminescence detected to be of a different degree than that exhibited in air being indicative of the presence of a fluid besides air.

17. The method of claim 14 further including:
    exciting said light emitting region of said photonic structure with energy from an excitation source that is passed through said transparent substrate of said photonic structure, said energy known to cause said light emitting region to luminesce in the presence of air.

18. The method of claim 17 further including:
    detecting luminescence from said photonic structure as perceived through said transparent substrate of said photonic structure with a detector, a luminescence detected to be of a different degree than that exhibited in air being indicative of the presence of a fluid besides air.

19. The method of claim 18 further including
    coupling said energy from said excitation source to said transparent substrate of said photonic structure with an optical fiber, and coupling said luminence from said light emitting region of said photonic structure, and as perceived through said transparent substrate of said photonic structure, to said detector with an optical fiber.

20. The method of claim 14 in which a series of said photonic structures are operably coupled to said receptacle for sensing the presence of fluid at a number of locations within said receptacle.

21. The apparatus of claim 1 in which said fluid is at least one of air, benzene, methanol, acetone, diethyl ether, methylene chloride, tetrahydrofuran, toluene, o-xylene and water.

22. A method for sensing the presence of a fluid comprising:
providing a photonic structure that includes
a transparent substrate and
a layer of group IV semiconductor material formed on said transparent substrate having a light emitting region that is relatively porous compared to a portion of said layer outside said region;
disposing said photonic structure so that said light emitting region will contact said fluid when said fluid is present and so that light emitted from said light emitting region is viewable through said transparent substrate unobstructed by said fluid to be sensed.

23. The method of claim 22 further including:
exciting said light emitting region of said photonic structure with energy from an excitation source that is passed through said transparent substrate of said photonic structure outside the presence of said fluid to be sensed, said energy known to cause said light emitting region to luminesce in the presence of air.

24. The method of claim 23 further including:
detecting luminescence from said photonic structure as perceived through said transparent substrate of said photonic structure and outside the presence of said fluid to be sensed with a detector, a luminescence detected to be of a different degree than that exhibited in air being indicative of the presence of a fluid other than air.

25. The method of claim 24 further including
coupling said energy from said excitation source to said transparent substrate of said photonic structure with an optical fiber, and
coupling said luminence from said light emitting region of said photonic structure, and as perceived through said transparent substrate of said photonic structure, to said detector with an optical fiber.

26. The method of claim 14 in which a series of said photonic structures are used for sensing the presence of fluid at a number of separate locations.

27. An apparatus comprising:
a receptacle for containing a fluid to be sensed;
a fluid sensor including
a transparent substrate and
a porous region of group IV semiconductor material formed on said transparent substrate, said region being disposed to be contacted by said fluid when said fluid is present;
an excitation source for stimulating said porous region to generate luminescence; and
a detector for detecting said luminescence,
said porous region being operably coupled to said excitation source and said detector so that light emitted from said porous region in response to a stimulus from said exciation source is received through said transparent substrate and is measured by said detector at a wavelength.

28. The apparatus of claim 27 wherein said exciation source is a source of electomagnetic radiation.

29. The apparatus of claim 27 wherein said excitation source is a source of electrical charge.

30. The apparatus of claim 27 wherein said detector measures light emitted from said porous region in response to a stimulus from said excitation source that is received through said transparent substrate by said detector and that is measured at a plurality of wavelengths.

* * * * *